SOLID STATE RECTIFYING CIRCUIT ARRANGEMENTS

Filed Sept. 15, 1966 2 Sheets-Sheet 1

INVENTORS
FRANK F. FANG
WEBSTER E. HOWARD, JR.

BY S. P. Tedesco
ATTORNEY

United States Patent Office 3,458,798

Patented July 29, 1969

3,458,798

SOLID STATE RECTIFYING CIRCUIT ARRANGEMENTS

Frank F. Fang and Webster E. Howard, Jr., Yorktown Heights, N.Y., assignors to International Business Machines Corporation, Armonk, N.Y., a corporation of New York Filed Sept. 15, 1966, Ser. No. 579,754
Int. Cl. H02m 7/44, 7/68
U.S. Cl. 321—43 18 Claims

ABSTRACT OF THE DISCLOSURE

A field effect transistor is adapted as a self-contained rectifying device wherein the direction of current flow is controlled by an alternating current signal applied to the gate electrode in phase with the power signal. Preferably, the gate bias voltage is much larger than the source-drain voltage such that the conduction channel is very rapidly and heavily inverted during the forward conduction cycle whereby maximum power is delivered to the load and, also, such that the conduction channel is very heavily depleted during the reverse conduction cycle whereby reverse current is minimized.

This invention relates to solid state rectifying circuit arrangements and, more particularly, to such arrangements employing field effect transistors as active circuit devices to minimize power dissipation.

The objectives of the integrated circuit technology are to reduce the size, weight, and unit cost of the individual active circuit elements and, also, to achieve improved reliability, speed, and power utilization from a system viewpoint. Such objectives are sought to be achieved by the concurrent fabrication on a single semiconductor wafer of a plurality of solid state circuit devices of microminiature dimensions along with functional interconnections therebetween. Due to such microminiaturization, power capacity and, also, allowable signal levels are substantially reduced. Accordingly, to achieve such objectives, it is requisite that the efficiency of the active circuit devices be maximized while power dissipation, or loss, is minimized.

Generally, rectifying devices conduct current substantially only in a forward direction, such devices presenting a very high impedance to current flow in a reverse direction. An ideal rectifying device is one which exhibits zero resistance to current flow in the forward direction and infinite resistance to current flow in the reverse direction. In the present art, semiconductor, or PN junction, diodes are widely employed as rectifying devices. Although compatible with the integrated circuit technology, semiconductor diodes do not exhibit a sufficiently high efficiency since PN junctions are inherently dissipative and introduce excessive power loss in the system. This power loss, or dissipation, is particularly severe for low voltage-high current supplies which are essential for most solid state electronics circuits. Rectification in semiconductor diodes results from the presence of a potential barrier, i.e., a PN junction, which inhibits the flow of carriers such that the total number of conduction carriers is dependent upon the direction of current flow. Basically, the rectification process involves the injection of minority carriers across the PN junction which, along with space charge effects, limits the speed, or frequencies, at which semiconductor diodes can be operated. In addition, substantial power is dissipated internally, e.g., by series resistance, such that maximum power is not delivered to the load and undesirable heating is introduced into the system. In other words, a certain forward voltage must be applied across the PN junction to initiate current flow in a forward direction; often, and most importantly, such forward voltage constitutes a very substantial portion of the available signal voltage. To date, PN junction devices have found widespread application as rectifying devices due to the unavailability of more efficient devices.

Accordingly, an object of this invention is to provide an improved solid state rectifying circuit arrangement.

Another object of this invention is to provide an improved solid state rectifying device exhibiting substantially no forward voltage drop and substantially infinite resistance in a reverse direction.

Another object of this invention is to provide an efficient high power-high frequency solid state rectifying device compatible with the integrated circuit technology.

Another object of this invention is to provide a rectifying element comprising an insulated-gate field effect transistor having a large figure of merit for high current applications.

Another object of this invention is to provide solid state rectifying circuit arrangements, both half-wave and full-wave, capable of delivering maximum output power to a load.

These and other objects and features of this invention are achieved by utilizing a solid state device wherein at least one PN junction is available to inhibit reverse current flow and wherein the effects of such junction are effectively eliminated during the entire forward conduction cycle. Accordingly, such devices exhibit substantially no forward drop and deliver maximum power to the load. In accordance with the particular aspects of this invention, an insulated-gate field effect transistor is adapted as a self-contained rectifying device wherein the direction of current flow is controlled by an alternating-current signal applied to the gate electrode in phase with the power signal. As hereinafter described, conduction in a field effect transistor is a surface mechanism whereby carrier density along the surface, or conduction channel, of the semiconductor wafer between the source and drain electrodes is modulated by normal electric fields $E_n$ generated by gate electrode bias. During quiescent, or cut-off, operation, the source and drain diffusions define PN junctions with portions of the semiconductor wafer defining the conduction channel. During the forward conduction cycle, gate electrode bias $V_g$ inverts the conduction channel whereby an ohmic conduction path is defined between source and drain electrodes in the power circuit. Accordingly, PN junctions along the conduction path are effectively eliminated by gate electrode bias $V_g$ such that the forward drop across the field effect transistor when "on" is totally determined by the channel conductance $G_{sd}$. During "cut-off" state, the conduction channel is depleted such that PN junction between the source and drain electrodes and the conduction channel, respectively, are reverse biased and present substantially infinite resistance to reverse-current flow.

In accordance with particular aspects of this invention, gate bias voltage $V_g$ is much greater than source-drain voltage $V_{sd}$, i.e., $V_g >> V_{sd}$, whereby the conduction channel is very rapidly and heavily inverted during the forward conduction cycle whereby maximum power is delivered to the load. Conversely, the conduction channel is very highly depleted during reverse conduction cycle whereby reverse current is minimized. Since the impedance of the gate circuit is very high, substantially no power is dissipated therein. It is evident that the gate electrode can be biased synchronously in square wave fashion so that the conduction channel is very heavily inverted during the entire forward conduction cycle whereby distortion of the power signal is minimal.

The channel conductance $G_{sd}$ of a field effect transistor during the forward conduction cycle is given by $G_{sd}=Wqn\mu/L$ or $G_{sd}=WCV_g\mu/L$ where W is the width of the conduction channel, L is the length of the conduction channel, $q$ is electronic charge, $n$ is carrier density, $\mu$ is carrier mobility, and C is gate capacitance. By forming the field effect transistor of proper geometry, e.g., $W/L>1000$, and applying a sufficiently large gate bias voltage $V_g$, the channel conductance $G_{sd}$ of the field effect transistor during the forward conduction cycle can be very large. Since there is no off-set voltage in the power circuit, ideal rectifier characteristics can be very closely approximated. Also, since series resistance $R_s$ varies inversely as the applied gate bias voltage $V_g$, the power delivered to the load during the forward conduction cycle can be controlled either by the amplitude and/or phase of the gate bias voltage $V_g$.

The foregoing and other objects, features and advantages of the invention will be apparent from the following more particular description of preferred embodiments of the invention, as illustrated in the accompanying drawings.

Figure 1:
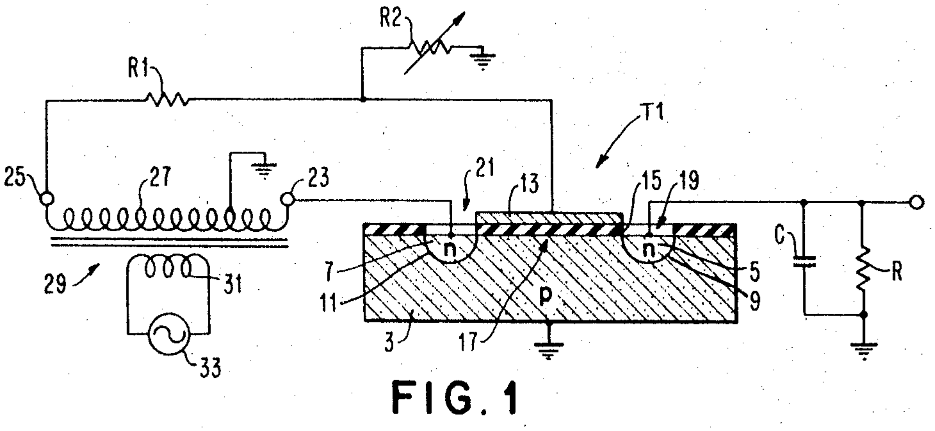
FIG. 1 illustrates a single-phase, half-wave rectifier arrangement comprising a single field effect transistor.

As illustrated in FIG. 1, a half-wave rectifying arrangement in accordance with this invention comprises a field effect transistor T1 formed in wafer 3 of relative high-resistivity P-type semiconductor material, e.g., silicon, germanium, etc. Source and drain electrodes 5 and 7 of N-type conductivity are diffused into and define rectifying junctions 9 and 11, respectively, with wafer 3. Metallic gate electrode 13 is registered over normally depleted surface portion 17, or conduction channel, of wafer 3 between source and drain electrodes 5 and 7 and spaced therefrom by a thin insulating layer 15, e.g., silicon dioxide, aluminum oxide, etc. Conduction between source and drain electrodes 5 and 7 is primarily a surface conduction mechanism and occurs when conduction channel 17 is inverted by normal electric fields $E_n$ applied along conduction channel 17, i.e., gate electrode 13 is biased positively with respect to the source and drain electrodes. While NPN-type field effect transistor T1 has been illustrated, it is evident that field effect transistors of the PNP-type may be similarly employed.

Due to the nature of the wafer 3-insulating layer 15 interface, excess donor states are normally present along conduction channel 17. In the PNP-type field effect transistor, such donor states define an accumulation layer whereby conduction channel 17 is normally depleted and negative-gate bias is required to support source-drain current $I_{sd}$. In the NPN-type field effect transistor, such excess donor states define an ohmic conduction path, i.e., an inversion layer between source and drain electrodes 5 and 7, whereby such transistor normally exhibits a depletion mode operation, i.e., substantial source-drain current $I_{sd}$ flows at zero-gate bias. In the practice of this invention, it is preferred that tansistor T1, whether NPN-type or PNP-type, exhibits enhancement mode operation. The conduction characteristics of a field effect transistor, regardless of type, can be controlled by various techniques, for example, as described in the F. Fang et al. patent application Ser. No. 457,571, filed on May 21, 1965, and in the G. Cheroff et al. patent application Ser. No. 468,481, filed on June 30, 1965, each being assigned to a common assignee.

When wafer 3 is formed of silicon, insulating layer 15 can be formed of thermally grown silica ($SiO_2$), e.g., 1000 A. to 5000 A., by exposing the wafer at a temperature between 900° C. and 1250° C. to an oxygen atmosphere. During the fabrication process, insulating layer 13 can be used for masking purposes during the diffusion of source and drain electrodes 5 and 7. For example, diffusion windows 19 and 21 are opened in insulating layer 15 by conventional photolithographic techniques. With insulating layer 15 acting as a diffusion mask, wafer 3 is heated at temperatures ranging from 1100° C. to 1250° C. in a reactive atmosphere capable of forming N-type source and drain electrodes 5 and 7. Subsequently, gate electrode 13 and also operative connections to source and drain electrodes 5 and 7 can be formed over insulating layer 15 by conventional metallization processes.

Drain electrode 7 and gate electrode 13 are connected to terminals 23 and 25, respectively, of tapped secondary winding 27 of transformer 29. That portion of secondary winding 27 across which gate electrode 13 is connected has a sufficiently large number of windings to generate a high voltage-low power signal when primary winding 31 is energized by alternating current souce 33; the amplitude of voltage $V_g$ applied to gate electrode 13 can be controlled by resistor arrangement R1–R2. Also, that portion of secondary winding 27 across which drain electrode 7 is connected has a lesser number of windings to generate a low voltage-high power signal in the power circuit when primary winding 31 is energized. The power circuit can be traced from ground through secondary winding 23 to drain electrode 7, conduction channel 17, source electrode 5 and ground along capacitive filter load RC.

Figure 5:
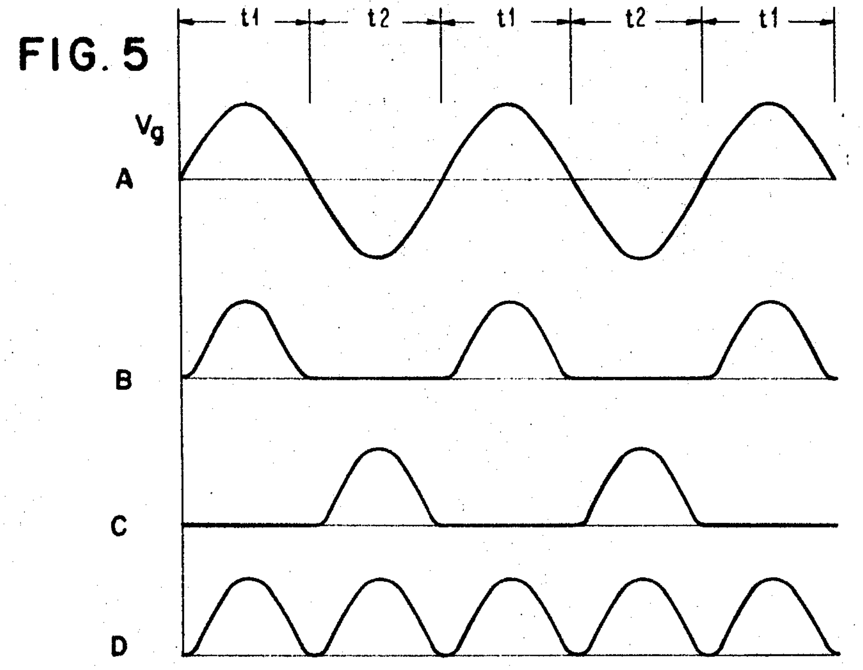
FIG. 5 is a family of curves useful in understanding the circuit arrangements of FIGS. 1, 3, and 4.

When primary winding 31 is energized, alternating current signals are applied in phase to drain electrode 7 and gate electrode 13, respectively. During positive excursions of gate bias voltage $V_g$, carriers are induced into so as to invert conduction channel 17 whereby junctions 9 and 11 are effectively removed from the power circuit. Since gate bias voltage $V_g$ is of large amplitude, i.e., $V_g \gg V_{sd}$, conduction channel 17 is heavily inverted, i.e., an ohmic conduction path is defined, whereby maximum power is delivered to the load RC connected at source electrode 5. As shown in FIG. 5A, positive and negative excursions of gate bias voltage $V_g$ are applied to gate electrode 13 during time intervals $t$1 and $t$2, respectively, and in phase with the power signal applied to drain electrode 7. Accordingly, during time intervals $t$1, transistor T1 is "on" and power is delivered to load RC as indicated in FIG. 5B. During time intervals $t$2, gate electrode 13 is biased beyond "cut-off," i.e., majority carriers are repelled from conduction channel 17, whereby conduction through transistor T1 is inhibited and substantially no power is delivered to load RC. During time interval $t$2, junctions 9 and 11 minimize reverse leakage current in the power circuit.

Figure 2:
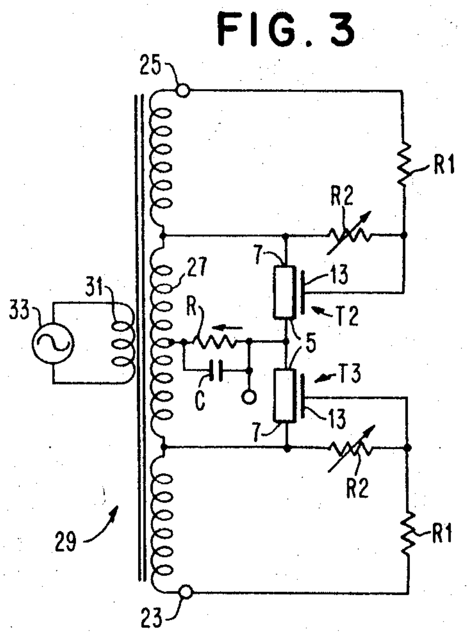
FIG. 2 illustrates the current-voltage characteristics of the field effect transistor when adapted in the circuit arrangement of FIG. 1 compared with those of a semiconductor diode.

In FIG. 2, the current-voltage characteristics of transistor T1 in the circuit arrangement during each forward conduction cycle at time interval $t$1 are compared with those of a conventional semiconductor diode in FIG. 2. As illustrated by curve I, a threshold potential $V_d$ at least sufficient to overcome the potential barrier presented by the PN junction is required to induce forward conduction in a semiconductor diode. Such a PN junction is inherently dissipative, the semiconductor diode exhibits a power loss very nearly equal to $I_jV_d$ where $I_j$ is current through the junction device and $V_d$ is the barrier voltage, for example, about 1 volt in silicon. Moreover, the power loss in a semiconductor diode is also dependent upon the series resistance $R_s$. Semiconductor diodes employed as rectifiers exhibit series resistances $R_s$ which differ substantially from the ideal, i.e., zero resistance during the forward conduction cycle, as shown by the finite slope of curve I.

The effect of independently controlling transistor T1 of FIG. 1 during the forward conduction cycle by a signal not present in the power circuit is illustrated by the curve II, which is representative of a family of curves (cf. curves III and IV) of varying slopes and originating at the origin; the slope of each such curve, i.e., the channel conductance $G_{sd}$, is determined by materials choice, device geometry, etc. Since gate bias voltage $V_g$ is large and in phase with the power signal applied at drain electrode 7, transistor T1 is conductive during the entire forward conduction cycle and power loss is small for low voltage operation. For example, for a given current I', power loss in transistor T1 having characteristics indicated by curve II is given by $I'V_d'$ as compared to $I'V_d+I'^2R_s$ for a semiconductor diode having characteristics indicated by curve I, although the channel resistance $1/G_{sd}$ of transistor T1 is substantially greater than the series resistance $R_s$ of the diode. When the respective series resistances are equal, as indicated by curves I and III, power loss in a field effect transistor is substantially less than that in the semiconductor diode, i.e., $$I'V_d+I'^2R_s \gg I'V_d''$$

Moreover, power loss in transistor T1, i.e., channel resistance $1/G_{sd}$, can be controlled by a proper selection of device geometry and/or operating parameters. As hereinabove indicated, channel conductance $G_{sd}$ varies directly as the ratio $W/L$ of conduction channel 17, the carrier mobility $\mu$ and, also, gate capacitance C. Accordingly, either of these device parameters can be maximized to enhance the channel conductance $G_{sd}$ and increase the power delivered to load RC. For example, source and drains 5 and 7 of transistor T1 can be formed in interdigital fashion to maximize the ratio $W/L$ in a relatively small area; also, insulating layer 15 can be deposited as thin as 500 A.–1000 A. Also, the channel conductance $G_{sd}$ of a field effect transistor employed as a rectifying element can be varied continuously by means of gate bias voltage $V_g$. When the effective series resistance $1/G_{sd}$ is minimized, the current-voltage characteristics of the field effect transistor can be made to approximate ideal diode characteristics as shown by curve III of FIG. 2. For example, power delivered to the load RC can be continuously controlled by appropriate adjustment of resistor arrangement R1–R2. As hereinabove indicated, channel conductance $G_{sd}$ varies directly with gate bias voltage $V_g$. Accordingly, by adjusting resistor R2, channel conductance $G_{sd}$ of transistor T1 can be varied, e.g., as indicated by curve IV, to achieve controlled rectification. In practice, a small field effect transistor can be used in place of resistor R2 to effect electronic control.

For low power applications, the unipolar, or junction, field effect transistor and the insulated-gate field effect transistor can be employed. Since the product of the dielectric constant and the maximum normal fields $KE_n$, which is a measure of the number of carriers that can be controlled, in the insulated-gate field effect transistor structure exceeds by about an order of magnitude that of the PN junction in the unipolar field effect transistor, the former is better adapted for large power applications. Moreover, the insulated-gate field effect transistor is self-contained in that substantially no current is drawn in the gate electrode circuit either during the forward and reverse conduction cycles due to the presence of insulating layer 15. For rectifying arrangements employing unipolar transistors, the PN junction defining the gate electrode would normally be forward-biased during half of the AC cycle; accordingly, unilateral conduction devices would be required in the gate electrode circuit of the unipolar transistor to inhibit conduction at this time. Alternatively, the gate electrode of the unipolar transistor structure can be normally biased to inhibit conduction during the reverse conduction cycle such that enhancement mode operation is achieved.

Figure 3:
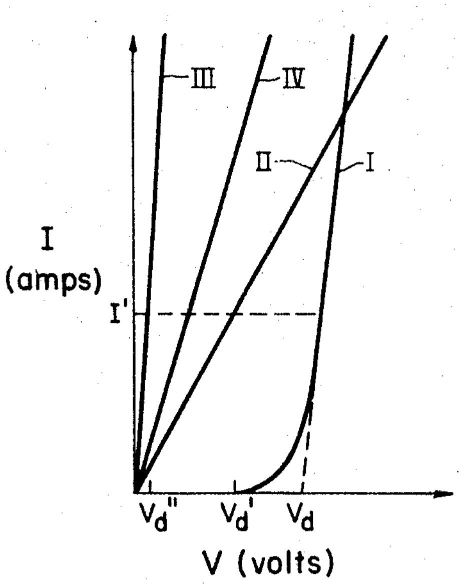
FIG. 3 illustrates schematically a single-phase, full-wave rectifier arrangement comprising a pair of field effect transistors.

A full-wave rectifier arrangement is illustrated in FIG. 3 as comprising a pair of transistors T2 and T3, same reference characters being employed to identify similar structures as in FIG. 1. As illustrated, the respective source 5-drain 7 circuits of transistors T2 and T3 are connected across an intermediate portion of the secondary winding 27 of transformer 29. Gate electrodes 13 of transistors T2 and T3, respectively, are connected to the opposite terminals 23 and 25 of secondary winding 27. Again, load RC is multipled to the source electrodes 5 of transistors T2 and T3 and connected to the center tap of secondary winding 27 such that current flow therethrough is in a same direction when either transistor is conducting. When primary winding 31 is energized by source 33, positive and negative voltages are developed at the opposite terminals 23 and 25 of secondary winding 27 such that transistors T2 and T3 conduct alternately during time intervals $t1$ and $t2$, respectively, as shown in FIGS. 5B and 5C. For example, during time intervals $t1$, transistor T2 is driven into conduction, as illustrated by FIG. 5B, whereby current flows through load RC as indicated by the arrow; at this time, conduction through transistor T3 is inhibited. During time intervals T2, transistor T3 is driven into conduction and conduction through transistor T2 is inhibited as illustrated by FIG. 5C, whereby current flows through load RC in the same direction. Accordingly, total current through load RC is the sum of currents through transistors T2 and T3 during time intervals $t1$ and $t2$, respectively, as illustrated by FIG. 5D. Again, resistor arrangements R1–R2 are provided for each transistor T2 and T3 to control power delivered to load RC.

Figure 4:
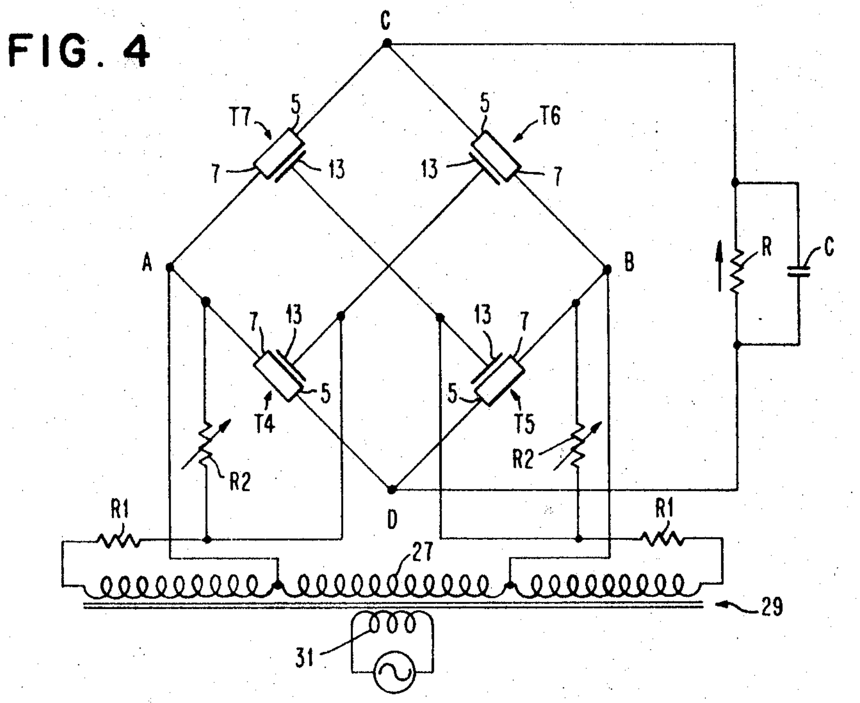
FIG. 4 illustrates schematically single-phase, full-wave bridge circuit in accordance with the invention.

An alternating arrangement for effecting full-wave rectification is illustrated in FIG. 4 wherein transistors T4, T5, T6, and T7 are arranged in bridge-fashion. As illustrated, the respective gate electrode 13 of transistors T4 and T6 and transistors T5 and T7 are multipled and connected across portions of secondary winding 27 of transformer 29. Also, nodes A and B defined by the multipled drain electrodes 7 of transistors T4 and T7 and transistors T5 and T6, respectively, are connected across portions of secondary winding 27. The load RC is connected across the nodes C and D defined by the multipled source electrodes 5 of transistors T4 and T5 and transistors T6 and T7, respectively. In operation, the field effect transistors in opposite legs of the bridge arrangement are driven into conduction simultaneously during positive and negative excursions of the alternating current input signal applied to primary winding 31 during time intervals $t1$ and $t2$, respectively. For example, during time intervals $t1$, transistors T4 and T6 are driven into conduction and transistors T5 and T7 are inhibited whereby current flows through load RC, as indicated by the arrow and illustrated in FIG. 4B. During time intervals $t1$, the power circuit is traced from node A through transistor T4 to node D, load RC, node C, transistor T6, and along an intermediate portion of secondary winding 27. During time intervals $t2$, transistors T5 and T7 are driven into conduction and transistors T4 and T6 are inhibited whereby current flows through load RC in the same direction. During time intervals $t2$, the power circuit can be traced from node B through transistor T5, node D, load RC, node C, transistor T7, and along the intermediate portion of secondary winding 27. Again, current through load RC is the sum of the currents along the distinct power paths which flow in a same direction through RC so as to achieve full-wave rectification as illustrated in FIG. 5D.

While the invention has been particularly shown and described with reference to preferred embodiments thereof, it will be understood by those skilled in the art that various changes in form and details may be made therein without departing from the spirit and scope of the invention.

What is claimed is:

1. A rectifying arrangement comprising a field effect transistor including a semiconductor body having a source, drain and gate electrodes, means for applying a first alternating current signal to said drain electrode, means for applying a biasing signal to said gate electrode in phase with said first alternating current signal to support current flow between said source and drain electrodes during first polarity excursions of said first alternating current signal and to inhibit current flow between said source and drain electrodes during second polarity excursions of said alternating current signal, and load means connected to said source electrode.

2. The rectifying arrangement as defined in claim 1 wherein said biasing means includes further means for applying a second alternating signal to said gate electrode.

3. The rectifying arrangement as defined in claim 1 including further means for varying the magnitude of said biasing signal whereby power delivered to said load is controlled.

4. The rectifying arrangement as defined in claim 1 wherein said applying means is operative to apply a square wave to said gate electrode.

5. A rectifying arrangement comprising a body of semiconductor material of first conductivity type and having spaced source and drain diffusions of second conductivity type in one surface thereof, portions of said one surface intermediate said spaced diffusions defining a conduction channel, a gate electrode for applying electric fields to modulate carrier density along said conduction channel, means for applying a first alternating current signal to one of said diffusions, load means connected to the other of said diffusions, and means for biasing said gate electrode in phase with said first alternating current signal to induce current flow along said conduction channel and between said spaced diffusions during first polarity excursions of said first alternating current signal.

6. A rectifying arrangement comprising a body of semiconductor material of first conductivity type and having spaced source and drain diffusions of second conductivity type in one surface thereof, portions of said one surface intermediate said spaced diffusions defining a conduction channel, a gate electrode spaced from said one surface for applying electric fields to modulate carrier density along said conduction channel, means for applying first and second alternating current signals in phase to one of said diffusions and to said gate electrode, respectively, said second alternating current signal being of greater amplitude than said first alternating current signal and effective to modulate carrier density along said conduction channel to support current flow between said spaced diffusions during first polarity excursions of said first alternating current signal and to inhibit current flow between said spaced diffusions during second polarity excursions of said first alternating current signal, and load means connected to the other of said diffusions.

7. The rectifying arrangement as defined in claim 6 wherein said applying means comprises transformer means.

8. The rectifying arrangement as defined in claim 7 including further means for varying the amplitude of said second alternating current signal applied to said gate electrode whereby power delivered to said load means is controlled.

9. A full-wave rectifying arrangement comprising first and second field effect transistors of same type, each of said transistors including a semiconductor body having source, drain and gate electrodes, each of said gate electrodes when biased being effective to support current flow between corresponding one of said source and drain electrodes, load means connected to said source electrodes of each of said transistors, and means for applying an alternating current signal in phase to said drain and gate electrodes of each of said transistors, said alternating current signals applied to each of said transistor being out of phase, each of said transistors being responsive to same polarity excursions of said alternating current signals to support conduction between corresponding source and drain electrode whereby full-wave rectification is achieved.

10. The full-wave rectifying arrangement as defined in claim 9 wherein said alternating current signals applied to said gate electrodes of each of said transistors are square waves.

11. The full-wave rectifying arrangement as defined in claim 9 wherein said applying means includes transformer means connected to said drain and gate electrodes of each of said transistors.

12. The full-wave rectifying arrangement as defined in claim 9 wherein said applying means includes means for varying the amplitude of said alternating current signals applied to said gate electrodes of each of said transistors whereby power delivered to said load means is controlled.

13. A full-wave rectifying arrangement comprising first and second field effect transistors, each of said transistors including a semiconduction body of first conductivity type having spaced source and a drain diffusions of second conductivity type in one surface thereof, portions of said surface intermediate corresponding source and drain diffusions defining a conduction channel, and a gate electrode spaced from said conduction channel for applying electric fields therealong to modulate carrier density and support current flow between said source and drain electrodes, load means connected to said source electrodes of each of said transistors, and means for applying alternating current signals in phase to said drain and gate electrodes of each of said transistors, said alternating current signals applied to each of said transistors being out of phase, each of said first and second transistors being responsive to same polarity excursions of said alternating current signals to support conduction between corresponding source and drain electrodes whereby full-wave rectification is achieved.

14. The full-wave rectifying arrangement as defined in claim 13 wherein said applying means are operative to apply alternating current signals of greater amplitude to said gate electrodes than to said drain electrodes of each of said transistors.

15. A rectifying arrangement comprising first, second, third and fourth field effect transistors of same type and arranged in bridge-fashion, each of said transistors including source, drain and gate electrodes said drain electrodes of said first and second transistors and said third and fourth transistors being connected to define a first pair of nodes, said source electrodes of said first and fourth transistors and said second and third transistors being connected to define a second pair of nodes, load means connected across said second pair of nodes, means for applying a first alternating current signal across said first pair of nodes, and means for biasing said gate electrodes of said first and third transistors and said second and fourth transistors to support conduction between corresponding source and drain electrodes during positive and negative excursions, respectively, of said first alternating current signal whereby full-wave rectification is achieved.

16. The rectifying arrangement as defined in claim 15 wherein each said first, second, third and fourth transistors comprise a semiconductor body of first conductivity type having spaced source and drain diffusions of second conductivity type, surface portions of said body intermediate said spaced diffusions defining a conduction channel, and a metallic gate electrode spaced from said surface portions to modulate carrier density along said conduction channel.

17. A rectifying arrangement as defined in claim 15 wherein said biasing means includes means for applying oppositely-phased alternating current signals to said gate electrodes of said first and third transistors and said second and fourth transistors.

18. The rectifying arrangement as defined in claim 15 whereby said biasing means includes further means for varying the amplitude of said oppositely-phased alternating current signals whereby power delivered to said load is controlled.

References Cited

UNITED STATES PATENTS

| | | | |
|---|---|---|---|
| 3,237,018 | 2/1966 | Leger | 307—88.5 |
| 3,283,221 | 11/1966 | Heiman | 307—88.5 |
| 3,354,380 | 11/1967 | Fly et al. | 321—18 |

OTHER REFERENCES

Amelco Semiconductor, "Field Effect Transistors Theory and Application Notes," June 1962, p. 7.

G. H. Olsen: "Field Effect Devices," Wireless World, June 1965, p. 260.

JOHN F. COUCH, Primary Examiner

W. M. SHOOP, Jr., Assistant Examiner

U.S. Cl. X.R.

307—251; 321—47